United States Patent [19]
Hag

[11] Patent Number: 5,315,558
[45] Date of Patent: May 24, 1994

[54] INTEGRATED CIRCUIT MEMORY WITH NON-BINARY ARRAY CONFIGURATION

[75] Inventor: Ejaz U. Hag, Sunnyvale, Calif.

[73] Assignee: VLSI Technology, Inc., San Jose, Calif.

[21] Appl. No.: 52,143

[22] Filed: Apr. 21, 1993

Related U.S. Application Data

[62] Division of Ser. No. 783,040, Oct. 25, 1991, Pat. No. 5,220,518.

[51] Int. Cl.[5] ............................................. G11C 11/40
[52] U.S. Cl. ............................ 365/230.01; 365/189.04; 365/230.03
[58] Field of Search ................ 365/51, 189.04, 230.01, 365/230.03

[56] References Cited

U.S. PATENT DOCUMENTS

| | | | |
|---|---|---|---|
| 3,906,458 | 9/1975 | Ehlers | 340/172.5 |
| 4,047,163 | 9/1977 | Choate et al. | 340/173 |
| 4,811,297 | 3/1989 | Ogawa | 365/189 |
| 4,918,662 | 4/1990 | Kondo | 365/210 |

*Primary Examiner*—Terrell W. Fears
*Attorney, Agent, or Firm*—Clifton L. Anderson

[57] ABSTRACT

Memory arrays of non-binary physical dimensions are disclosed. A novel addressing scheme provides that multiple word lines are activated in response to each received address code. Generally, at least two physical block rows containing blocks of an addressed logical block row are activated in response to each address. Block rows containing redundant blocks are activated in response to every address. In a specific embodiment, a 1 M-bit array arranged in 11 rows of blocks and 6 columns of blocks functions as an 8×8 block logical array, with two blocks available for redundancy. The availability of non-binary physical arrays affords a designer new flexibility in meeting packaging constraints and redundancy specifications.

9 Claims, 3 Drawing Sheets

|      | BCA          | BCB          | BCC          |
|------|--------------|--------------|--------------|
|      | ME    MF     | MU    MV     | MY    MZ     |
| BRC  |    B3        |    B7        |    BR        |
|      | M6    M7     | MM    MN | MW    MX     |
|      | MO    MP     | MQ    MR     | MS    MT     |
| BRB  |    B4        |    B5        |    B6        |
|      | MG    MH     | MI    MJ | MK    ML     |
|      | M8    M9     | MA    MB     | MC    MD     |
| BRA  |    B0        |    B1        |    B2        |
|      | M0    M1     | M2    M3     | M4    M5     |

INTEGRATED CIRCUIT MEMORY WITH NON-BINARY ARRAY CONFIGURATION

This is a divisional of application Ser. No.: 07/783,040 filed: Oct. 25, 1991 now U.S. Pat. No. 5,220,518.

BACKGROUND OF THE INVENTION

The present invention relates to integrated circuits and, more particularly, to integrated circuit memory devices. A major objective of the present invention is to provide for greater flexibility in integrated circuit memory design to meet package size constraints.

Recent technological progress has been closely identified with the development of high-speed, high-density integrated circuits. Among the most prevalent of integrated circuit devices are random access memories (RAMs). RAMs are typically divided into dynamic random access memories (DRAMs) and static random access memories (SRAMs). DRAMs have the advantages of relatively low cost and relatively high density, but require refresh cycles that incur speed and power penalties. SRAMs are favored where memory access times must be kept to a minimum. An increasingly common computer architecture uses high-density DRAM memory for bulk memory and SRAM as cache memory to speed access to the most commonly used operations and data. SRAMs also have relatively low power requirements and are commonly used in battery powered units, including portable computers.

A conventional SRAM architecture includes an array of memory cells arranged in rows and columns. Data is communicated to and from the memory device via data ports. Cells are selected as a function of address codes received at address inputs. Read and write operations are selected at control inputs. In addition, power and ground, for example, nominal 5 V and 0 V, respectively, are supplied at respective terminals. An address decoder transforms received address codes into control signals that implement the requested cell selection. The address decoder transmits signals along word lines causing cells in a cell row to be coupled to respective true and false bit lines of a selected cell column. Some recent devices use divided word line architectures that divide the cell array into separately addressable blocks. This reduces capacitive loading by decreasing the number of cells in a cell row sharing a common row-select line. The address decoder also transmits signals to column pass gates or column transmission gates to couple selected bit lines to respective sense amplifiers and thence to the data ports.

SRAM designers, along with the designers of other memory types, are faced with competing demands for more advanced devices and for devices that are compatible with existing standards. For example, there is a demand for devices with greater memory capacity that fit into industry standard package configurations. If a memory device is incorporated within a novel package, it is less likely to be retrofit into existing systems and into systems already well along their design path. In addition, many systems builders are reluctant to depend on a single source, especially for memory devices, so they will not accept a new package until other manufacturers adopt it as a standard. Standardization of a new package configuration requires agreement between fierce industry competitors. Standards continue to evolve, but the process is time-consuming and its outcome is often uncertain. Therefore, if a new device can be incorporated into an accepted standard package, its acceptance in the marketplace is more easily assured.

However, the constraints imposed by standard packages can be burdensome. Memory devices have generally evolved by factors of four. For example, common SRAM devices have included 1024-bit (1 kilobit=1k), 4k, 16k, 64k, 256k, and 1024k (1 megabit=1M) memories. Binary addressing schemes favor memories in which the number of addressable cells is a power of two. For a rectangular array of cells, this requires that the number of cell rows is a power of two, and that the number of cell columns is a power of two. Thus, a $64k=2^{16}$ memory can have $256=2^8$ cell rows and 256 cell columns. When processing technology permits denser memory arrays, the tendency is to double the number of cell rows and double the number of cell columns. Thus, the next generation device would be $512 \times 512$, which yields a 256k-bit memory.

When processing technology provides for 50% linear reduction in cell pitch, the next generation can be arranged in roughly the same area as the previous generation. However, pitch reductions are usually less dramatic. Furthermore, pitch reductions can be offset by increasing routing complexity and increased architectural complexity—e.g., the more sophisticated block decode logic used in bigger memory devices. Hence, while processing technology provides some savings in device area, memories with larger capacity generally require more area.

Thus, a device with four times as many cells fabricated using a process providing a 25% reduction in feature size could require an array 50% longer and 50% wider than the previous generation memory. When no suitable standard package is available, some adjustments must be made. Sometimes, a standard package can accommodate a change in one dimension and not the other. In this case, a designer could limit the number of cell rows and cell columns in one dimension while taking advantage of the latitude in the other dimension. Thus, a $512 \times 256$ memory using the advanced technology could fit a package; however, the resulting device would have a 128k memory size, which is non-standard. If sufficient latitude in one dimension were available, a 256k memory could be arranged as $1024 \times 256$ cells. While these accommodations can be made, the number of options is still quite limited.

As an extreme example, a package that can accommodate a maximum of $500 \times 500 = 250,000$ cells, accommodates a maximum of $256 \times 256 = 64k$ binary-addressable cells. It is difficult to optimize memory capacity and yet conform to the dimensional constraints of standard packages.

The provision of redundant cells in memory devices modifies the basically binary character of memory array dimensions, but only slightly. The more cells in a memory device, the more likely it is that at least one of these cells will be defective. Extra cells can be manufactured on a device to substitute for cells found during testing to be defective. A laser can be used to reroute addressing signals to the substitute cells. The substitute cells can be arranged as additional cell columns or cell rows. In a divided word or other block architecture, the substituted cells can be arranged in separate blocks, or as additional rows or columns in blocks containing the main cells.

Generally, redundant blocks are more conveniently implemented than are redundant cell rows or redundant cell columns in each block. However, implementation of redundant blocks in a conventional divided word architecture requires one redundant block for each block row or one redundant block for each block column. Generally, this requirement results in a greater level of redundancy than is required, thus wasting valuable area on an integrated circuit.

To permit substitution of any of the main cells without drastically increasing addressing complexity, substitution is on a row-by-row, column-by-column or block-by-block basis. Even if only one cell is defective, its entire block, cell row, cell column, block row or block column will be replaced. To permit any cell to be replaced, redundant blocks, columns and rows are arranged to extend either the entire length or the entire width of the memory array. It is not necessary to provide redundancy over both the full width and the full length. Therefore, redundant cells can be added so that the length of the array is increased, but not the width; alternatively, the redundant cells can be added so that the width of the array is increased, but not the length. The choice can be made to conform to packing constraints.

Accordingly, a memory device incorporating redundancy will not generally have an array that has a binary power of cells. Such a device could have a semi-binary array that is $2^m \cdot (2^n + r)$, where m, n and r are positive integers. For example, four percent redundancy can be provided in a 256×266 array. One dimension of the array is binary and the other is near binary. This would still fall far short of efficient utilization of the 250,000 cell capacity for the package in the above example.

Thus, providing redundancy can use some of the area otherwise wasted when array dimensions conform to packaging constraints. However, this saving is limited. Redundancy requirements arise primarily from yield considerations. Rerouting complexities and the law of diminishing returns limit the amount of useful redundancy. The basic difficulty of efficiently accommodating newer, higher-capacity memories in standard packages remains.

SUMMARY OF THE INVENTION

In accordance with the present invention, an integrated circuit memory array employs a non-binary array design. The non-binary design provides flexibility in conforming to array size limitations, including those imposed by packaging constraints. Odd cells can be used for redundancy.

As applied to an array, "non-binary" refers herein to a rectangular array in which neither the number of columns nor the number of rows is a power of two. For example, 3×3 is a non-binary array, while 2×2 is a binary array and 2×3 is "semi-binary". More generally, a non-binary array has p rows and q columns where $2^m < p < 2^{m+1}$ and $2^n < q < 2^{n+1}$, and where m, n, p and q are integers. Preferably, $p \cdot q > 2^{m+n+1}$. In this case, addressing can be provided for $2^{m+n+1}$ cells, while $p \cdot q - 2^{m+n+1} = r$ cells are available for redundancy. A redundancy of up to 15% can be provided where $$2^{m+n+1} < p \cdot q < 2^{m+n+1.2}.$$

In a block architecture, such as a divided word architecture, the foregoing constraints can be applied to the arrangement of blocks. A memory array can include P·Q blocks where $2^M < P < 2^{M+1}$ and $2^N < Q < 2^{N+1}$. Preferably, $2^{M+N+1} < P \cdot Q < 2^{M+N+1.2}$, where $P \cdot Q - 2^{M+N+1} = R$ blocks are available as redundant blocks.

Preferably, the redundant blocks are arranged in a single block row or block column containing main blocks as well. Redundant address decoding provides that the word line in the block row containing redundant blocks is always addressed when any block row is addressed. Therefore, most addressing will activate at least two word lines. Some embodiments can activate a single word line in response to some address codes when the block to be addressed is in the same block row as a redundant block. In other embodiments, the main word decoder resolves redundant decoding so that only one word line is activated at any given time.

Given a packaging standard, a non-binary array can usually provide a memory of greater capacity that is available using the nearest binary or semi-binary array. Furthermore, redundancy can be conveniently provided on a block-by-block basis while providing for flexible selection of the degree of redundancy. The prior art, on the other hand, would require an entire row or column of redundant blocks, generally providing more redundancy than would be useful. Alternatively, the prior art would provide redundancy on a row-by-row or column-by-column basis, making addressing more cumbersome. These and other features and advantages of the present invention are apparent from the description below with reference to the following drawings.

BRIEF DESCRIPTION OF THE DRAWING

FIG. 2 is a schematic of the physical arrangement of memory blocks included in the SRAM device of FIG. 1.

FIG. 3 is a schematic of the logical arrangement of memory blocks included in the SRAM device of FIG. 1.

DESCRIPTION OF THE PREFERRED EMBODIMENTS

Figure 1:
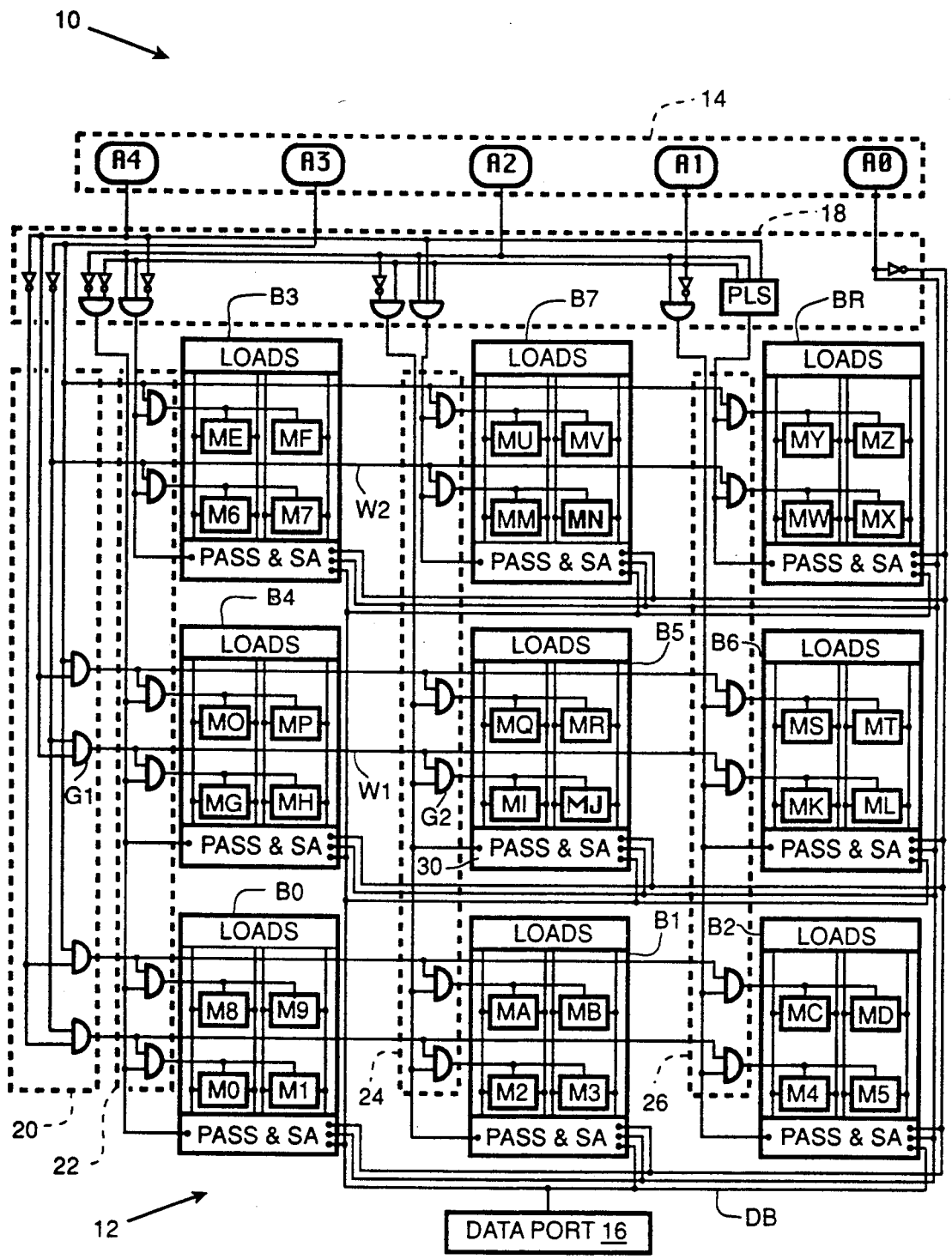
FIG. 1 is a schematic of a SRAM device in accordance with the present invention.

In accordance with the present invention, a SRAM device 10 comprises a memory array 12, five address inputs 14, a data port 16, a predecoder 18, a main word-line decoder 20, and block decoders 22, 24 and 26, as shown in FIG. 1. Memory array 12 includes thirty-six memory cells M0-MZ arranged in nine blocks with four cells in each block. The nine blocks include eight main blocks B0-B7 and one redundant block BR.

The physical arrangement of blocks B0-B7 and BR is shown in FIG. 2. These nine blocks are arranged in a 3×3 block array with three block rows BRA, BRB, and BRC, and three block columns BCA, BCB and BCC. Block row BRA includes blocks B0-B2; block row BRB is constituted by B4-B6 and block row BRC contains B3, B7 and BR. Block column BCA includes blocks B0, B4 and B3; block column BCB contains blocks B1, B5 and B7; and block column BCC is constituted by blocks B2, B6 and BR. Block array 12 is non-binary in that neither the number (three) of block rows nor the number (three) of block columns is a power of two.

SRAM 10 is designed to be incorporated in a host system that uses standard binary addressing. Accordingly, SRAM device is logically configured as a logical array 32 with two logical block rows and four logical block columns, as shown in FIG. 3. The blocks of logical array 32 are the same as the main blocks of physical array 12, each including four cells arranged in two cell rows and two cell columns. A lower logical block row includes main blocks B0–B3; an upper logical block row includes main blocks B4–B7. Redundant block BR is invisible to an incorporating system and thus is not represented in logical array 32. Of course, redundant block BR can be substituted for any of the main blocks that turns out to be defective. Addressing for SRAM 10 is explained below by way of example.

Address code input 10011, i.e., A4=1, A3=0, A2=0, A1=1, A0=1, selects memory cell MJ. As indicated in FIG. 3, address A4 selects a block row and addresses A2 and A1 select a block column. Thus, addresses A4, A2 and A1 collectively serve to select a block. In this case, block B5 is selected. Address A3 selects a cell row within a block and address A0 selects a cell column within a block. A3=0 selects the lower cell row and A0=1 selects the right cell column of block B5. Thus, the lower right cell MJ of block B5 is selected for reading or writing.

This logical addressing scheme is implemented in the context of the physical block configuration of FIGS. 1 and 2. The example address code is received at address ports 14. Predecoder 18 generates inverted versions of A4 and A3, namely, $\overline{A4}$ and $\overline{A3}$. Four signal lines respectively carrying signals $\overline{A4}$, A4, $\overline{A3}$, A3 are provided by predecoder 18 to main wordline decoder 20. In the example, A4=1, $\overline{A4}$=0, A3=0, and $\overline{A3}$=1.

Main wordline decoder 20 includes four AND gates, one for each cell row of block rows BRA and BRB. Each AND gate represented in FIG. 1 is implemented as a NAND gate followed by an inverter. Of the four AND gates in main word line decoder 20, address code 10011 activates only the AND gate G1 with A4=1 and $\overline{A3}$=1 at its inputs. This AND gate drives the word line W1 for the lower cell row of physical block row BRB.

In addition, a main word line W2 is activated as it is connected to the signal line carrying $\overline{A3}$=1. In general, all addresses activate two main word lines, one from the four associated with physical block rows BRA and BRB, and one associated with physical block row BRC. This duplication is required to ensure that all blocks of each logical block row are addressed by each row block address. For example, address code A4=0 must activate all blocks of the lower logical block row, i.e., blocks B0–B3. These blocks are distributed between physical block rows BRA and BRC. Likewise, address code A4=1 must activate all blocks of the upper logical block row, i.e., blocks B4–B7. These blocks are distributed between physical block rows BRB and BRC. Thus, physical block row BRC must always be activated. This arrangement also provides for activation of redundant block BR for any predetermined block address combination.

Predecoder 18 also provides logical combinations of the block addresses A4, A2 and A1 for use by block decoders 22, 24 and 26. Specifically, $\overline{A2}\cdot\overline{A1}$ and $\overline{A4}\cdot A2\cdot A1$ are provided to block decoder 22, $\overline{A2}\cdot A1$ and $A4\cdot\overline{A2}\cdot A1$ are provided to block decoder 24, and $\overline{A2}\cdot A1$ is provided to block decoder 26. In addition a programmable logic section PLS is provided for connecting the appropriate logical combination of A4, A2 and A1 to block decoder 26 when redundant block BR is substituted for a defective main block. When the redundant block BR is not required, PLS is decoupled from block decoder 26.

When the received address code is 10011, $\overline{A2}\cdot A1$ is the only block select combination of A4, A2 and A1 provided by predecoder that is true. The corresponding signal line is applied to AND gates coupled to blocks B1 and B5. Of these AND gates, only G2 has two true inputs, one representing $\overline{A2}\cdot A1$ and the other coupled to W1, which carries $A4\cdot\overline{A3}$. Thus, address bits A1–A4 select the two cells MI and MJ of the lower cell row of block B5.

Predecoder 18 also provides column decoding by providing an inverted version and an uninverted version of address bit A0, i.e., A0 and $\overline{A0}$ are provided. In the present case, A0 is true, so the right cell column of block B5 is activated, uniquely selecting cell MJ. Selected cell MJ is then coupled via pass gate and sense amplifier (PASS & SA) section 30 to a single-bit data bus DB, which completes the electrical connection to data port 16. Section 30 includes sense amplifiers that are used during read operations and associated transmission gates that bypass the sense amplifiers during write operations.

To minimize loading on data bus DB, it is preferable to enable only the sense amplifier for the selected block. Accordingly, the block decoders 22, 24 and 26 can be coupled for enabling the sense amplifiers using a logical combination of A4, A2 and A1. Given the example address code of 10011, A4=1, A2=0 and A1=1. This combination would enable only the sense amplifier, or associated transmission gates, of block B5.

For comparison, the process of cell selection in response to a second address code 10111 is explored briefly. The second address code 10111 differs from the first address code 10011 only in that A2=1 instead of A2=0. Given the second address code, $A4\cdot A2\cdot A1$ is true; this signal is provided to block decoder 24 to select block B7. The remaining address bits select the lower right cell MN. Those skilled in the art can determine the operation of SRAM 10 in response to other address code inputs.

Figures 4, 5:
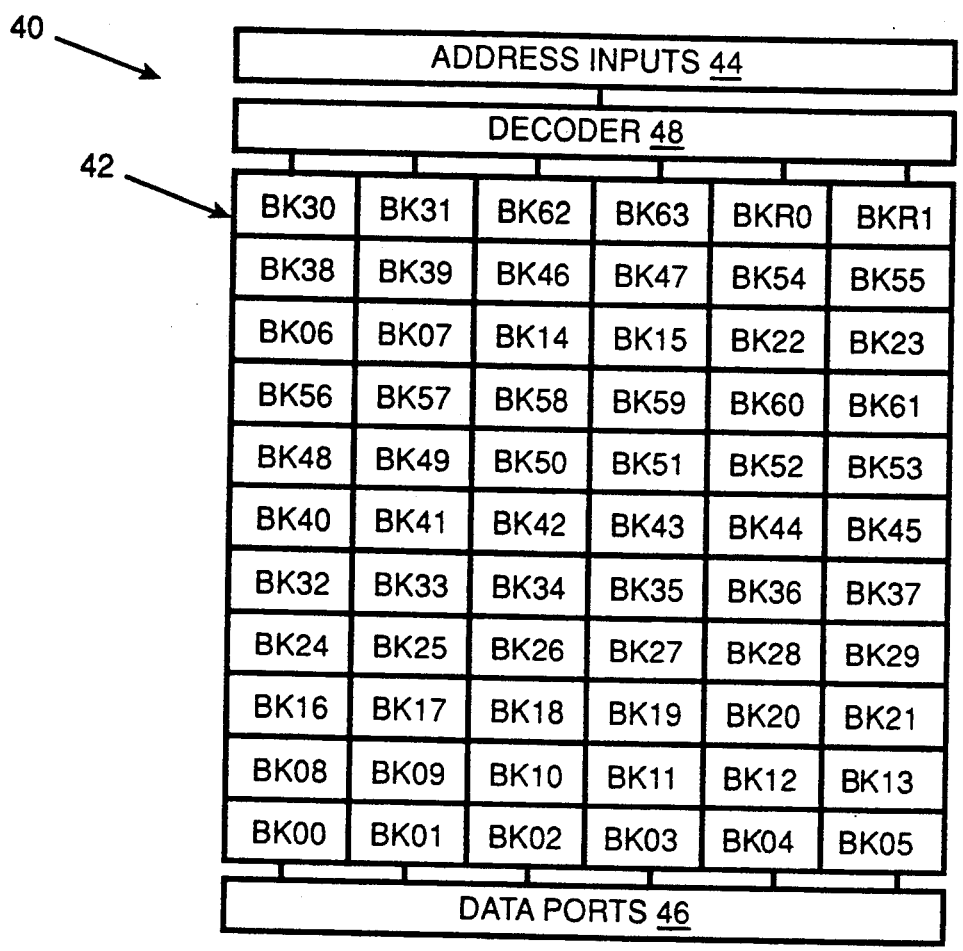
FIG. 4 is a schematic of another SRAM device showing the physical configuration of its blocks in accordance with the present invention.
FIG. 5 is a schematic of the logical arrangement of memory blocks included in the SRAM device of FIG. 4.

In an alternative embodiment of the present invention, a SRAM 40 comprises a memory array 42, address inputs 44, data ports 46 and a decoder 48, as shown in FIG. 4. SRAM 40 has a one-megabit capacity, configured as 128 k 8-bit words; accordingly, there are seventeen address inputs 44 and eight data ports 46. Memory array 42 includes sixty-six memory blocks, including sixty-four main blocks BK00–BK63 and two redundant blocks BKR0, BKR1. The sixty-six blocks are arranged in eleven block rows. The eleven block rows are identified by their rightmost blocks, BK05, BK13, BK21, BK29, BK37, BK45, BK53, BK61, BK23, BK55, and BKR1, respectively. The six block columns are identified by their topmost blocks, BK30, BK31, BK62, BK63, BKR0, and BKR1, respectively. Memory array 42 is non-binary since neither the number of block rows (11) nor the number of block columns (6) is a power of two.

Each block includes 16K memory cells arranged in a $128\times128$ array. Thus, while each block is a binary subarray, non-binary array 42 is arranged as $1408\times768$ cells.

From the point of view of the incorporating system, SRAM 40 functions in accordance with its logical block configuration as a binary logical block array 52, shown in FIG. 5. Binary logical array 52 is arranged as $8=2^3$ logical block rows and $8=2^3$ logical block columns. The logical block rows are distinguished by their rightmost blocks, BK07, BK15, BK23, BK31, BK39, BK47, BK55 and BK63, respectively. The logical block columns are distinguished by their topmost blocks, BK56, BK57, BK58, BK59, BK60, BK61, BK62, and BK63, respectively. Redundant blocks BKR0 and BKR1 of physical array 42 are transparent to the incorporating system and thus are not included in binary logical array 52. Thus, binary logical block array 52 includes $64=2^6$ of the 66 blocks of physical array 42.

The relationship between non-binary physical block array 42 and binary logical block array 52 can be explored further in terms of the transformation required to obtain array 42 from 52. The last two logical block columns BK62 and BK63 of binary logical block array 52 are removed, leaving the six physical block columns of physical block array 42. The blocks of the removed logical block columns are rearranged to constitute the three additional physical block rows BK23, BK55 and BKR1 of physical block array 42.

More specifically, physical block row BK23 includes the six blocks at the intersection of the bottom three logical block rows BK07, BK15 and BK23 and the removed rightmost pair of logical block columns BK62 and BK63. Physical block row BK55 includes the six blocks at the intersection of three logical block rows BK39, BK47 and BK55 and removed rightmost pair of logical block columns BK62 and BK63. Physical block row BKR1 includes the four blocks at the intersection of the two logical block rows BK31, BK63 and removed rightmost pair of logical block columns BK62 and BK63. The last two blocks of physical block row BKR1 are the redundant blocks BKR0 and BKR1.

SRAM 40 accepts seventeen-bit address codes of the form A16–A0. Addresses A16, A15 and A14 select among the eight logical block rows of FIG. 5. Addresses A13–A7 select one of 128 cell rows with a selected block. Addresses A6, A5 and A4 select among the eight logical block columns. Addresses A3–A0 select among the sixteen eight-bit words in each row of each block.

To implement this addressing scheme in the context of physical block array 42, decoder 48 provides for activation of multiple word lines for each address code received. Block decoding selects among the blocks in the activated word lines. A given address code activates word lines in the two physical block rows including the eight blocks belonging to the logical block row selected by a given address code. For example, to select a word in block BK00, word lines in physical block rows BK05 and BK23 are activated. Physical block row BK05 must be activated because it includes the selected block BK00; physical block row BK23 is selected because it includes blocks BK06 and BK07 that are included in logical block BK07 along with block BK00. The same physical block rows BK05 and BK23 would be activated to select a word in block BK06.

Likewise, physical block row BK23 and one of physical block rows BK13 and BK21 would be activated whenever a word from logical block rows BK15 or BK23 was selected. Physical block row BK55 and one of physical block rows BK37, BK45 and BK53 would be selected whenever a block from logical block rows BK39, BK47 or BK55 were selected.

Physical block row BKR1 is always selected, providing access to redundant blocks BKR0 and BKR1 when they are substituted for any main block that might have proved defective. When a main block from logical block rows BK31 and BK63 is selected, only two physical block rows are selected, i.e., BKR1 and one of physical block row BK29 and physical block row BK61. Otherwise, three physical block rows are selected, physical block row BKR1, one of physical block rows BK23 and BK55, and one of the lower eight physical block rows. Thus, multiple block row addressing provides for the non-binary array design and for the desired redundancy.

In general, the present invention is applied to a block array with P·Q blocks arranged in P block rows and Q block columns where $2^M < P < 2^{M+1}$ and $2^N < Q < 2^{N+1}$ and M, N, P and Q are positive integers. Efficient use of the invention requires that $P \cdot Q > 2^S$, where $S = M + N + 1$. This leaves room for $R = P \cdot Q - 2^S$ redundant blocks. Up to 15% redundancy can be provided where $$2^{M+N+1} < P \cdot Q < 2^{M+N+1.2} \qquad (1)$$

For SRAM 10, P=Q=3 and M=N=1; P·Q=9, $2^{M+N+1}=2^3=8$. SRAM 10 conforms to the constraint expressed in equation (1), to wit, 8<9<9.2. Block redundancy R=1, or about 11%. SRAM 40 also conforms in that 64<66<73.5, where P=11, Q=6, M=3, N=2, $64=2^{M+N+1}=2^6$, and $73.5 \approx 2^{M+N+1.2}=2^{6.2}$. Block redundancy R=2, or about 3%.

The present invention applies to memory architectures in which cells are divided into blocks, and to architectures in which cells are not divided into blocks. Equation 2, which is formally identical with equation 1, expresses the preferred constraint as applied to the cells of an array:

$$2^{m+n+1} < p \cdot q < 2^{m+n+1.2} \qquad (2)$$

Physical array 12 of SRAM 10 is a 6-cell by 6-cell array. Thus, p=q=6, m=n=2. $2^{m+n+1}=2^5=32$, p·q=36, and $2^{m+n+1.2} \approx 36.8$. Thus, the constraint of equation 2 is met. Cell redundancy r=4 or about 13%.

Physical array 42 of SRAM 42 is a 1408-cell by 768-cell array. Thus, p=1408, q=768, p·q=1,081,344. Also, m=10, n=9, m+n+1=20. $2^{20}=1M=1,048,576$. $2^{m+n+1.2}=2^{20.2} \approx 1,204,498$. Thus, the constraint of equation 2 is met. Cell redundancy r=32,768 is about 3%.

Other embodiments of the present invention provide for different array dimensions, different divisions of cells into blocks, and different levels of redundancy. Herein, square arrays are rectangular arrays in which P=Q. Of course, the space allottable to redundant blocks can be used for other purposes, such as decoding. In this case, an array is still "rectangular" even though a portion is missing. The dimensions of the array, in this case, are the longest row by the longest column.

In the preferred embodiment, redundancy is resolved by the block decoder. In an alternative embodiment, the information regarding the substitution of redundant blocks for main blocks is provided to the main decoder so that only one word line need be activated at any given time.

While the preferred embodiments of the present invention conform to the constraints of equations 1 and 2, other embodiments do not. Different decoding schemes are provided for. Memory types other than SRAMs are provided for, for example, DRAMS, EPROMS, EEPROM, ROMS, and PROMS. Integrated circuits using alternative processing technologies, including hybrid processing technologies, are provided for. Silicon-based processing as well as alternative substrata processing technologies are provided for. In general, the intended size of a memory device will determine m and n. The desired level of redundancy will guide the selection of p and q within the constraints imposed by m and n. These and other modifications to and variations upon the preferred embodiments are provided for by the present invention, the scope of which is limited only by the following claims.

I claim:

1. A memory device comprising:
    an array of memory cells arranged in blocks, said blocks being arranged in P physical block rows and Q physical block columns, where $2^M < P < 2^{M+1}$ and $2^N < Q < 2^{N+1}$, where M, N, P and Q are integers, said memory cells being arranged in array cell rows and array cell columns, the cells in each of said blocks being arranged in block cell rows and block cell columns, each of said block cell rows being the intersection of a respective array cell row and a respective block, each of said block cell columns being the intersection of a respective physical array cell column and a respective block;
    data port means for communication between said memory cells and a host system;
    address input means for receiving address codes; and
    address decoding means for decoding said address codes so as to select at least one of said cells for communication with said host system for each of said address codes, said address decoding means including word line decoding means for selecting at least one of said array cell rows, said address decoding means including block decoding means for selecting at least one block so as to select the block cell row at the intersection of said array cell row and said block, said address decoding means including column decoding means selecting block cell columns of said at least one block;
    whereby the at least one cell at the intersection of said selected block cell row and said selected block cell column is selected for communication with said host system.

2. A device as recited in claim 1 wherein $2^S < P \cdot Q$, where $S = M + N + 1$.

3. A device as recited in claim 2 wherein $P \cdot Q < 2^T$ where $T = M + N + 1.2$.

4. A memory device as recited in claim 2 wherein said address decoding means defines a logical array of $2^M$ logical block rows and $2^{N+1}$ logical block columns, said logical array including $2^S$ of said blocks, said word line decoding means having row activation means for activating a physical cell row in each physical block row containing a block included in a logical block row selected by a given address code.

5. A memory device as recited in claim 4 wherein said physical array includes at least one redundant block which is not included in said logical array, said row activation means activating at least one physical cell row in said redundant block in response to at least one address code.

6. A memory device as recited in claim 4 wherein said blocks include R redundant blocks not included in said logical array where R is an integer and $2^S + R = P \cdot Q$.

7. A memory device as recited in claim 6 wherein all of said redundant blocks are included within a first block row of said P block rows.

8. A memory device as recited in claim 7 wherein said word line decoding means selects at least a first and a second of said physical array cell rows in response to at least some of said address codes, said first block row containing said first array cell row and a second of said P block rows containing said second array cell row.

9. A memory device as recited in claim 6 wherein said P block rows and Q block columns constitute a P+Q element set, all of said redundant blocks are included within one element of said set, said one element also including at least two blocks included in said logical array.

* * * * *